United States Patent
Park et al.

[11] Patent Number: 5,834,836
[45] Date of Patent: Nov. 10, 1998

[54] MULTI-LAYER BOTTOM LEAD PACKAGE

[75] Inventors: Kyei Chan Park, Su won; Kil-Sub Roh, Seoul, both of Rep. of Korea

[73] Assignee: Hyundai Electronics Industries Co., Ltd., Kyoungki-do, Rep. of Korea

[21] Appl. No.: 812,612

[22] Filed: Mar. 6, 1997

[30] Foreign Application Priority Data

Mar. 6, 1996 [KR] Rep. of Korea .................. 96-05799

[51] Int. Cl.⁶ .................................................. H01L 23/02
[52] U.S. Cl. .................. 257/686; 257/696; 257/724; 257/788; 257/667
[58] Field of Search .................................. 257/686, 696, 257/723, 724, 725, 788; 256/667

[56] References Cited

U.S. PATENT DOCUMENTS

| | | | |
|---|---|---|---|
| 5,061,990 | 10/1991 | Arakawa et al. | 257/724 |
| 5,101,324 | 3/1992 | Sato | 257/723 |
| 5,218,231 | 6/1993 | Kudo | 257/723 |
| 5,332,921 | 7/1994 | Dousen et al. | 257/723 |
| 5,438,224 | 8/1995 | Papageorge et al. | 257/723 |
| 5,477,082 | 12/1995 | Buckley, III et al. | 257/679 |
| 5,545,922 | 8/1996 | Golwalkar et al. | 257/723 |
| 5,555,488 | 9/1996 | McLellan et al. | 257/723 |
| 5,600,178 | 2/1997 | Russell | 257/696 |
| 5,600,181 | 2/1997 | Scott et al. | 257/724 |
| 5,635,760 | 6/1997 | Ishikawa | 257/724 |
| 5,677,567 | 10/1997 | Ma et al. | 257/723 |

Primary Examiner—David Ostrowski
Attorney, Agent, or Firm—Ware, Fressola, Van Der Sluys & Adolphson LLP

[57] ABSTRACT

A multi-layer bottom lead package of the present invention has semiconductor chips having: (a) bonding pads; (b) an insulating circuit film including (i) an insulating base film with through holes, (ii) first metal lines formed on upper and lower faces of the base film, (iii) protruding, conductive inner pads which are respectively formed on the first metal lines, being respectively connected to said bonding pads of each semiconductor chip, (iv) protruding, conductive outer pads which are formed on the first metal line, and (v) second metal lines formed along wall surface of the through holes to connect to the inner pads of each semiconductor chip; (c) a lead frame including an inner lead and outer lead for electrically connecting the outer pads of the insulating circuit film to an external device; and (d) a package body of encapsulating a predetermined area containing the semiconductor chips, the insulating circuit film and the inner leads of the lead frame, including a plurality of dimples formed at electrical connection positions for signal transfer with the external device, wherein the the outer leads extends to the dimple, each end of the outer leads being exposed at an equal level as the bottom surface of the package body.

22 Claims, 3 Drawing Sheets

MULTI-LAYER BOTTOM LEAD PACKAGE

BACKGROUND OF THE INVENTION

1. Field of the Invention

The present invention relates to a semiconductor packages, and more particularly to a multi-layer bottom lead package having a lead frame whose out leads are exposed at the lower portion of the package body.

2. Discussion of Related Art

Most of the conventional semiconductor packages are of the type where one semiconductor chip is molded with a resin such as an epoxy molding compound, which are called single in line package. The conventional packages have a lead frame whose out leads are projected from the package body, so as to provide a path for signal transfer between the chip and external devices.

Such a conventional semiconductor package is fabricated through the following processes: a die bonding process, mounting the semiconductor chip onto the paddle of a lead frame; a wire bonding process, electrically connecting the semiconductor chip on the paddle to the inner lead using a metal wire; a molding process, encapsulating a predetermined portion containing the chip, inner lead and metal wire with the epoxy resin to form a package body; and a trimming/forming process, trimming dam bars which support each lead of the lead frame, to separate into independent packages, while folding the outer leads projected from the package body into a predetermined form.

The semiconductor package thus manufactured is mounted by matching and soldering the out leads thereof to the pattern of the printed circuit board, to thereby perform a signal input/output operations from/to the external devices.

The semiconductor package however as described above is adequate in mounting only one chip because a die paddle of the lead frame has an area necessary for mounting only one chip and thus has a limitation in expanding its capacity. In addition, in order to mount two or more chips in the above structure, the die paddle of the lead frame should be enlarged, resulting in limitations in reducing package size, and in satisfying the need for advanced techniques in the manufacturing process.

Further, since the size of the package body and the pin configuration must be determined according to the international standards, the conventional semiconductor package has a limitation that it may not properly satisfy the demand of the user for specific circumstances such as an alteration of a pin array.

Meanwhile, to solve the problem under use of the lead-projected package, a bottom lead package has been proposed wherein the outer lead is exposed at the lower portion of the package body. However, this package requires die paddle for supporting the chip and a tie bar for supporting the die paddle, and it also requires that the chip and the inner leads of the lead frame must be connected to each other with a metal wire. This package has problems of deterioration in the reliability due to moisture permeation through microgaps existing between the tie bars and the package, and to bonding failure between the wire and the inner lead, resulting in limitations in reducing the size of the package. In addition, since the conventional bottom lead package must be manufactured in the sequence of trimming, forming, molding and trimming processes, this requires additional processes of reflash and scrubbing.

SUMMARY OF THE INVENTION

Accordingly, the present invention is directed to a multi-layer bottom lead package that substantially obviates one or more of the problems due to limitations and disadvantages of the related art.

An object of the present invention is to provide a multi-layer lead package which can embody a light, thin, short and miniaturized package, while having a higher capacity.

Another object of the present invention is to provide a multi-layer bottom lead package which can be easily assembled, enhance the reliability and easily cope with the demand of the user.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a multi-layer bottom lead package includes: (a) two or more semiconductor chips having a plurality of bonding pads; (b) an insulating circuit film having (i) an insulating base film with a plurality of through holes, (ii) a plurality of first metal lines formed on upper and lower faces of the base film, (iii) a plurality of protruding, conductive inner pads which are respectively formed on the first metal lines, being respectively connected to said bonding pads of each semiconductor chip, (iv) a plurality of protruding, conductive outer pads which are formed on the first metal line at a predetermined interval from the plurality of inner pads, and (v) a plurality of second metal lines formed along wall surface of the plurality of through holes to connect to the inner pads of each semiconductor chip, for electrically connecting inner pads each other which are positioned at the upper and lower surfaces of the base film; (c) a lead frame including an inner lead and outer lead for electrically connecting the outer pads of the insulating circuit film to an external device; and (d) a package body of encapsulating a predetermined area containing the semiconductor chips, the insulating circuit film and the inner leads of the lead frame, including a plurality of dimples formed at electrical connection positions for signal transfer with the external device, wherein the the outer leads extends to the dimple, each end of the outer leads being exposed at same level as the bottom surface of the package body.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

Figure 5A:
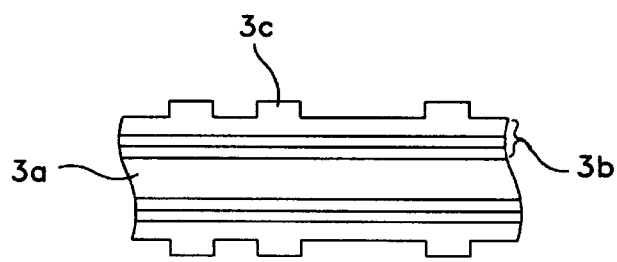
FIG. 5A is an enlarged vertical sectional view showing an insulating circuit film used in the multi-layer bottom lead package according to the present invention.
Figure 5B:
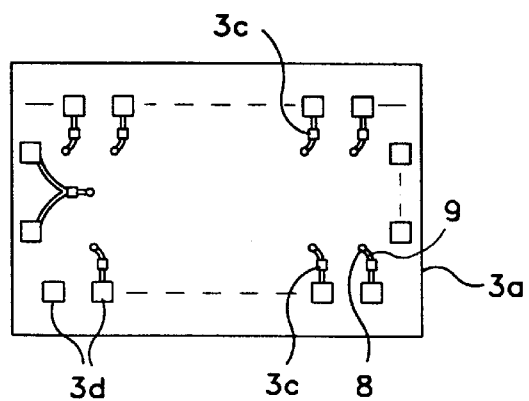
FIG. 5B is a plan view of FIG. 5A.
Figure 5C:
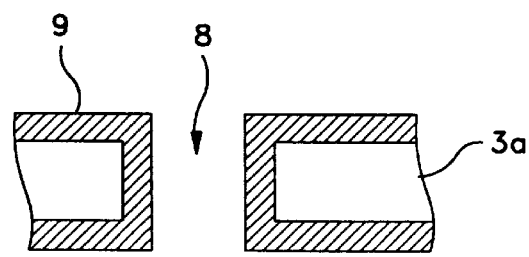
Figure 6:
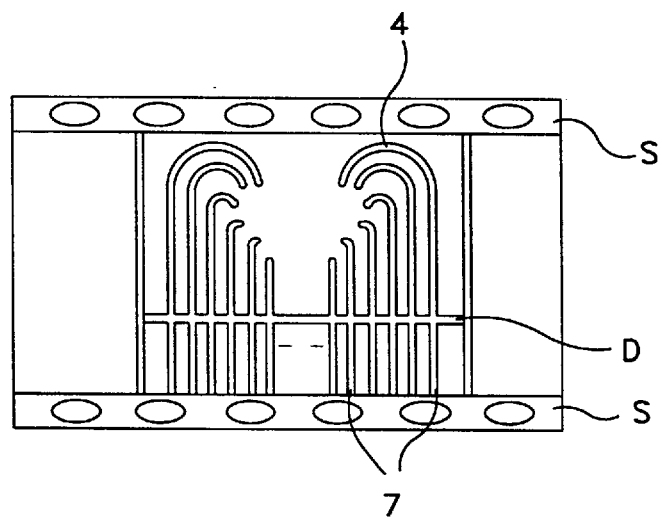
Figure 7:
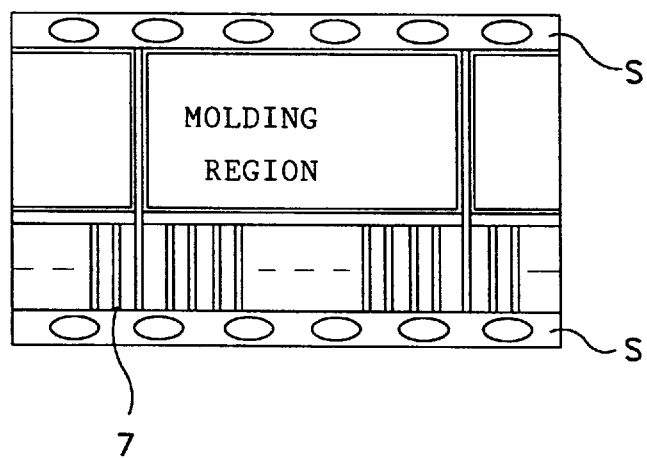

FIG. 5C being an enlarged cross sectional view showing the construction of a via hole;

FIG. 6 is a plan view showing the lead frame used in the multi-layer bottom lead package according to the present invention; and FIG. 7 is a plan view showing the state right after molding the multi-layer bottom lead package according to the present invention.

DETAILED DESCRIPTION OF PREFERRED EMBODIMENT

Reference will now be made in detail to the preferred embodiments of the present invention, examples of which are illustrated in the accompanying drawings.

Referring to FIGS. 1, 2, 3A and 3B, semiconductor chips 1 and 2 are attached to the upper and lower portions of an insulating circuit film 3 in a face-down method. Metal line patterns exist on the insulating circuit films 3 to maintain electrical connection between bonding pads of the semiconductor chips 1 and 2. In the face-down method, the upper portion of the chip, the portion in which the bonding pad electrodes are arranged, is arranged toward the insulating circuit film. The insulating circuit film 3 is also connected to an inner lead of the lead frame to form an electrical signal transfer path between the chips 1 and 2, and exterior devices.

An anisotropic conductor 5 including a resin and conductive particles fills the portion between the connecting part of the semiconductor chips 1 and 2, the insulating circuit film 3, the connecting part of the insulating circuit film 3 and inner lead 4 of the lead frame to electrically connect the above elements.

A predetermined area containing the semiconductor chips 1 and 2, the insulating circuit film 3 and the inner lead 4 of the lead frame is encapsulated with a molding compound, to thereby forming a package body 6. Dimples 6a of a predetermined size are formed at a lower portion of the package body 6 with two column according to an array of corresponding pad electrodes and outer leads 7 of the lead frame are respectively placed within the dimples 6a. The end portion of the outer lead 7 is folded outwards from the center of the package body, one outer lead and an adjacent outer lead on one column being folded in opposite directions. The folded ends thereof are portions to be electrically connected to an exterior device.

Construction of the insulating circuit film 3 used in the above-mentioned package will be described with reference to FIG. 4 and FIG. 5A to FIG. 5C.

Figure 4:
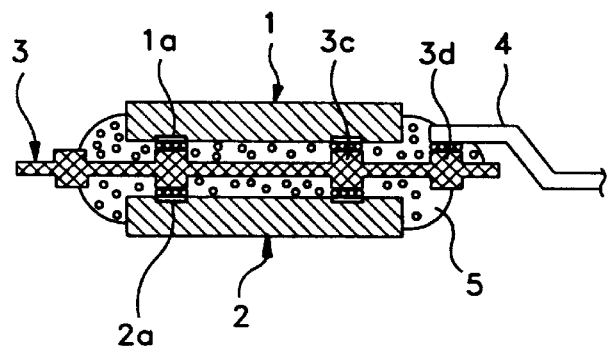
FIG. 4 is an enlarged cross sectional view showing essential parts of the multi-layer bottom lead package according to the present invention.

Referring to FIG. 4 and FIG. 5A to FIG. 5C, the insulating circuit film 3 has a base film 3a of polymer and a metal line 3b, the metal line 3b being formed at the upper and lower portions of the base film 3a, respectively. As shown in FIG. 5B, a plurality of inner pads 3c to be connected to the bonding pads 1a and 1b and a plurality of outer pads 3d to be connected to the inner leads 4 of FIG. 4 are formed on the metal line 3b to form an electrical connection between the semiconductor chips 1 and 2 and the inner leads 4 of the lead frame. In addition, a through-hole is provided at the insulating circuit film 3 to form one terminal by connecting identical terminals between the semiconductor chips 1 and 2 (e.g. connecting CAS to CAS, RAS to RAS), the chips being attached to the upper and lower portions of the insulating circuit film 3. A signal transfer path between the like terminals on the upper and lower faces of the insulating circuit film 3 is provided by forming a metal line at a predetermined portion on the inner walls of the through hole 8, as shown in FIG. 5C.

The insulating circuit film 3 is formed to have an approximate thickness of 1 mil (equivalent to 24 $\mu$m). The metal line 3b can be made of Cu, Ni, Au; Cu, Ni, Cr, Au; Cu, Ni, Co, Au; or the metal having an electrical resistivity of more than $10^{-8}$ $\Omega$/cm. The inner pad 3c and the out pad 3d are projected from the surface of the metal line 3b to a predetermined height. The height of the projection is in the range of 1–20 $\mu$m and the size thereof is in the range of 5 $\mu$m×5 $\mu$m–200 $\mu$m×200 $\mu$m. The via hole 8 is formed to have a diameter of 10–200 $\mu$m.

Referring to FIG. 6, the lead frame is constructed such that the inner leads 4 at the inside of the side rail S are connected to the out pads 3d of the insulating circuit film 3 and the out leads 7 for connection with a printed circuit board are supported by a dam bar D. In this construction, the die paddle and the tie bar for supporting the die paddle are not present in comparision with the conventional lead frame. Therefore, with this construction, it is possible to solve the problem of reliability due to failure in the die paddle and tie bar. In addition, the construction makes it possible to achieve a light, thin, short, miniaturized package.

The lead frame of the present invention as described above is made to have a thickness of at least more than 2 mil, and made of Cu, MF202, Alloy42, Orin194, Alloy 50 or any other metals having an electric conduction resistance value of more than $10^{-8}$ $\Omega$/cm.

Referring back to FIG. 2, the connecting portions of the inner leads 4 connected to the outer pads 3d of the insulating circuit film 3 are coated with a predetermined metal, such as silver, tin or indium, thus enhancing bonding force.

The anisotropic conductor 5 shown in FIG. 4 is a material including a resin of liquid or solid state, and conductive particles. The resin used includes epoxy or transformed epoxy resin, polyester or transformed polymer, acrylester or transformed ester, silicon resin, phenoxy resin, polyurethan, polysulfide, cyanoacrylate, polyalexin and other polymers which are hardened by thermal or ultraviolet radiation, or by being maintained at room temperature.

The above described particles for electric conduction is comprised of Ag, Ni, In, Sn, Indium tin oxide or an alloy thereof or the metal having an electric conduction resistance value of more than $10^{-8}$ $\Omega$/cm. The size of the particle is preferably in the range of 3 $\mu$m–15 $\mu$m, and the shape thereof may be in form of a globule, quadrilateral, triangle, hexahedron, square cone or triangle cone.

Referring back to FIGS. 3A and 3B, a plurality of dimples 6a which are form on the inside of the package body 6 are formed at the lower portion of the package body 6, and the outer leads 7 of the lead frame is placed within the dimple 6a of the package body 6. It is preferable that the end portions of the outer leads 7 are folded by a predetermined length from the end of the outer leads 7, and the folded portions are on an equal level with the bottom surface of the package body 6. The dimples 6a are arranged at two columns in the body 6 in a zigzag formation and the outer leads 7 corresponding thereto are also arranged in a similar zigzag formation. The dimple 6a is formed as a rectangle or a perfect square, the dimension of which is 4 mil×4 mil–4 mil×5 mil and the depth of which is 24 $\mu$m–400 $\mu$m.

Figure 3A:
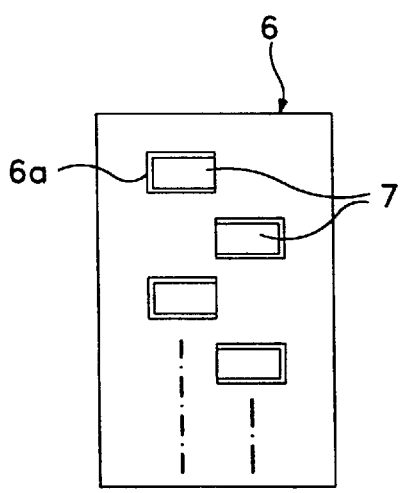
FIGS. 3A and 3B are diagrams showing the lower portion of the out lead of the multi-layer bottom lead package according to the present invention.
Figure 3B:
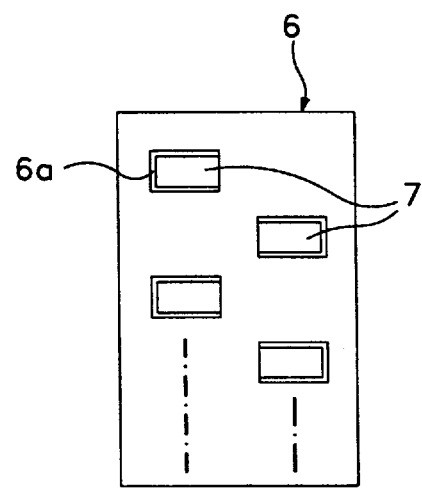

As shown in FIG. 3B, the dimples in one column may be arranged to be distanced from those at the other column by a predetermined distance, preferably 1 mil–5 mm in a zigzag formation. In order to maintain the distance, the inner leads are folded at a predetermined angle, the folded angle being in a range of −10°–+10°.

The manufacturing method of the multi-layer bottom lead package according to the present invention and its operating will be discussed hereinbelow.

First, the insulating circuit film 3 is manufactured in a general PWB (Printed Wiring Board) method. To expand, the metal lines 3b and pads are formed through depositing, plating, and patterning predetermined metal layers at the lower and upper portions of the base film 3a having a plurality of through holes 8, and then predetermined portions of the wall surface of the through hole are coated and plated with the metal, thus forming the insulating circuit film 3 having a plurality of pads and through holes.

The insulating circuit film 3 thus manufactured is doped with anisotropic conductor 5 and the inner leads 4 of the lead frame are connected to the out pads of the insulating circuit film 3. Thereafter, a first semiconductor chip 1 is bonded to one side of the insulating circuit film 3 in a face-down method wherein the bonding pad of the semiconductor chip is aligned to the inner pad of the insulating circuit film 3. A hardening step then takes place by using a thermal oven cure, an ultraviolet cure or a thermal compression method. After bonding the first semiconductor chip 1, the other side of the insulating circuit film 3 is doped with the anisotropic conductor 5. Next, a second semiconductor chip 2 is bonded thereto followed by one of the above curing operations.

After the above process, a general semiconductor package manufacturing process is performed. In other words, molding, trimming/forming, testing steps take place in sequential order. During the molding step, the line type of the outer lead molding region is made in a zigzag type and a predetermined depth of dimple is formed to make outer leads of the lead frame corresponding to the solder portions to formed in the mold body during the formation of the outer leads 7. In the trimming step, the dam bar D and side rail S are removed, leaving behind the outer leads 7 and the inner leads 4. In the forming step, the ends of the outer leads at the solder portions are folded and the folded ends enter the dimples, to thereby maintain an equal level with the bottom surface of the package body 6.

Figure 1:
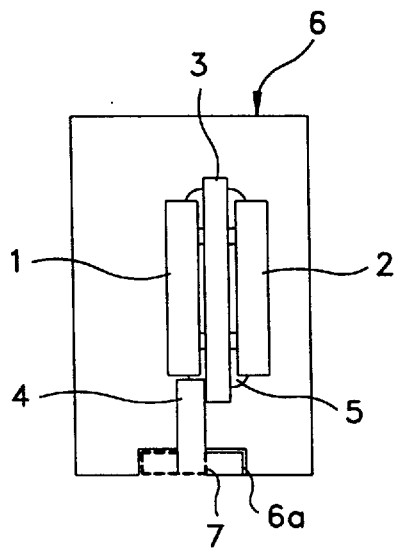
FIG. 1 is a cross sectional view showing the construction of a multi-layer bottom lead package according to one preferred embodiment of the present invention.
Figure 2:
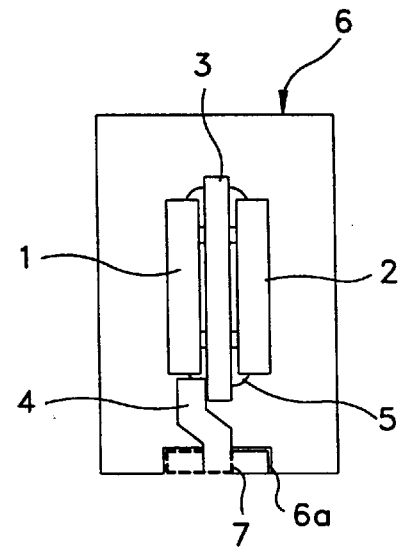
FIG. 2 is a cross sectional view showing the construction of a multi-layer bottom lead package according to another preferred embodiment of the present invention.

According to the above processes, the multi-layer bottom lead package shown in FIGS. 1 and 2 is thus manufactured. The manufactured package, in turn, is installed by soldering the exposed lead on the substrate, enabling a signal input/output operation.

As described above, in the multi-layer bottom lead package according to the present invention, the insulating circuit film, having a predetermined metal pattern and connection pads, is used to support chips 1 and 2 and to acts as an electrical connection wherein the chips are directly attached to the upper and lower faces thereof. Thus, it is possible to use the conventional manufacturing processes without alterations at its maximum degree and to load at least two or more chips on the package, enabling increased capacity of the package. Furthermore, by using the insulating circuit film and the anisotropic conductor, it is possible to provide a light and thin package of a high capacity.

In addition, in the multi-layer bottom lead package according to the present invention, the die paddles of the lead frame and the tie bar for connecting the die paddles, are not present, thus effectively preventing the permeation of moisture via a micro gap between the tie bar and the package body. It is also possible to prevent the error due to the α particle generated from the molding compound during the molding step by attaching the chips in a face-down method, thus enhancing reliability.

Furthermore, with the free design of the insulating circuit film, the present invention can meet the demands of the user in pin configuration.

It will be apparent to those skilled in the art that various modifications and variations can be made in a multi-layer bottom lead package of the present invention without departing from the spirit or scope of the invention. Thus, it is intended that the present invention cover the modifications and variations of this invention provided they come within the scope of the appended claims and their equivalents.

What is claimed is:

1. A multi-layer bottom lead package, comprising:
   (a) two or more semiconductor chips having a plurality of bonding pads;
   (b) an insulating circuit film comprising
       (i) an insulating base film with a plurality of through holes,
       (ii) a plurality of first metal lines formed on upper and lower faces of said base film,
       (iii) a plurality of protruding, conductive inner pads which are respectively formed on said first metal lines, being respectively connected to said bonding pads of each semiconductor chip,
       (iv) a plurality of protruding, conductive outer pads which are formed on said first metal line at a predetermined interval from the plurality of inner pads, and
       (v) a plurality of second metal lines formed along wall surface of the plurality of through holes to connect to said inner pads of each semiconductor chip, for electrically connecting inner pads each other which are positioned at the upper and lower surfaces of the base film;
   (c) a lead frame including an inner lead and outer lead for electrically connecting the outer pads of the insulating circuit film to an external device; and
   (d) a package body of encapsulating a predetermined area containing the semiconductor chips, the insulating circuit film and the inner leads of the lead frame, including a plurality of dimples formed at electrical connection positions for signal transfer with the external device, wherein the outer leads extends to the dimple, each end of the outer leads being exposed at an equal level as the bottom surface of the package body.

2. The multi-layer bottom lead package as claimed in claim 1, wherein said first and second metal lines are selected from a group comprising an alloy of Cu, Ni, Au, an alloy of Cu, Ni, Cr, Au, an alloy of Cu, Ni, Co, Au, and a metal having an electric conduction resistance value of more than $10^{-8}$ Ω/cm.

3. The multi-layer bottom lead package as claimed in claim 1, wherein said first and second metal layer of said metal line has a thickness of less than 1 mil.

4. The multi-layer bottom lead package as claimed in claim 1, wherein said inner pads and outer pads are projected from the surface of the first metal layer by 1–20 $\mu$m.

5. The multi-layer bottom lead package as claimed in claim 4, wherein said inner pads and out pads have the size of 5 $\mu$m×5 $\mu$m–200 $\mu$m×200 $\mu$m, respectively.

6. The multi-layer bottom lead package as claimed in claim 1, wherein the sizes of said inner pads and out pads are 5 $\mu$m×5 $\mu$m–200 $\mu$m×200 $\mu$m, respectively.

7. The multi-layer bottom lead package as claimed in claim 1, wherein the diameter of said through hole are in a range of 10–20 µm.

8. The multi-layer bottom lead package as claimed in claim 1, wherein said lead frame comprises dam bars for supporting said inner leads and said outer leads, said dam bars being connected to a side rail.

9. The multi-layer bottom lead package as claimed in claim 8, wherein said lead frame has a thickness of more than 2 mil.

10. The multi-layer bottom lead package as claimed in claim 1, further comprising an anisotropic conductor comprising a resin and given conductive particles contained therein, for electrically connecting said bonding pads to said insulating circuit film through said particle.

11. The multi-layer bottom lead package as claimed in claim 10, wherein said resin is in liquid or solid state, being selected from a group comprising: epoxy; transformed epoxy resin; polyester; transformed polymer; acrylester; transformed ester; silicon resin; phenoxy resin; polyurethan; polysulfide; cyanoacrylate; polyalexin and other polymers which are hardened by thermal radiation or ultraviolet radiation, or by being maintained at room temperature.

12. The multi-layer bottom lead package as claimed in claim 10, wherein said particle is selected from a group comprising Ag, Ni, In, Sn and Indium tin oxide.

13. The multi-layer bottom lead package as claimed in claim 10, wherein said particle comprises a metal having an electrical resistivity of more than $10^{-8}$ Ω/cm.

14. The multi-layer bottom lead package as claimed in claim 10, wherein shape of said particle is either one of a globule, a quadrilateral, a triangle, a hexahedron, a square cone or a triangle cone, size thereof being in the range of 3 µm–15 µm.

15. The multi-layer bottom lead package as claimed in claim 1, wherein end portions of said outer leads are folded at a predetermined distance from the ends of said outer lead, the folded portions being positioned at a same level with the bottom surface of said package body.

16. The multi-layer bottom lead package as claimed in claim 1, wherein said dimple comprises a rectangular form, the size of which is 4 mil×4 mil–4 mil×5 mil and the depth of which is 1 mil–400 µm.

17. The multi-layer bottom lead package as claimed in claim 16, wherein said dimple comprises a perfect rectangular form.

18. The multi-layer bottom lead package as claimed in claim 1, wherein said dimples are arranged in a zigzag formation.

19. The multi-layer bottom lead package as claimed in claim 18, wherein said dimples are formed in two columns corresponding to arrangement of said bonding pads, one column being arranged parallel to the other column and separated from the other column at a predetermined distance.

20. The multi-layer bottom lead package as claimed in claim 19, wherein said predetermined distance is 1 mil–5 mm.

21. The multi-layer bottom lead package as claimed in claim 19, wherein said inner lead is folded at a predetermined angle and the angle of the fold is in a range of −10–+10°.

22. A multi-layer bottom lead package, comprising:
  (a) two or more semiconductor chips, each semiconductor chip having a plurality of bonding pads;
  (b) an insulating circuit film having two opposing sides, each side being connected to one of the semiconductor chips, said insulating circuit film comprising:
    (i) a plurality of inner pads, each inner pad being connected to one of said bonding pads; and
    (ii) a plurality of outer pads, each outer pad separated a selected interval from each of the plurality of the inner pads;
  (c) a lead frame including an inner lead and an outer lead for electrically connecting the outer pads of the insulating circuit film to an external device, said lead frame having dam bars for supporting said inner leads and said outer leads; and
  (d) a package body encapsulating a predetermined area containing the semiconductor chips, the insulating circuit film and the inner leads of the lead frame, including a plurality of dimples formed at electrical connection positions for signal transfer with the external device.

* * * * *

UNITED STATES PATENT AND TRADEMARK OFFICE
CERTIFICATE OF CORRECTION

PATENT NO. : 5,834,836
DATED : November 10, 1998
INVENTOR(S) : Park et al.

It is certified that error appears in the above-identified patent and that said Letters Patent is hereby corrected as shown below:

Column 7, line 3 (claim 7, line 3) please delete "10-20 µm"

and insert --10-200 µm--.

Signed and Sealed this

Thirtieth Day of March, 1999

Attest:

Q. TODD DICKINSON

Attesting Officer

Acting Commissioner of Patents and Trademarks